United States Patent
Uesugi et al.

(10) Patent No.: US 8,264,800 B2
(45) Date of Patent: Sep. 11, 2012

(54) MAGNETIC FIELD DETECTING ELEMENT HAVING A TUNNEL BARRIER FORMED ON AN AMORPHOUS LAYER

(75) Inventors: Takumi Uesugi, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 1018 days.

(21) Appl. No.: 11/476,724

(22) Filed: Jun. 29, 2006

(65) Prior Publication Data

US 2007/0014053 A1     Jan. 18, 2007

(30) Foreign Application Priority Data

Jul. 13, 2005    (JP) .................................. 2005-204296
May 10, 2006   (JP) .................................. 2006-131510

(51) Int. Cl.
   *G11B 5/39*      (2006.01)
(52) U.S. Cl. ..................... 360/324.11; 360/324.2
(58) Field of Classification Search .......... 360/324.11, 360/324.12, 324.2
   See application file for complete search history.

(56) References Cited

U.S. PATENT DOCUMENTS

| | | | |
|---|---|---|---|
| 5,889,640 A * | 3/1999 | Hayashi et al. | 360/324.11 |
| 5,909,345 A * | 6/1999 | Kawawake et al. | 360/324.1 |
| 6,052,263 A * | 4/2000 | Gill | 360/324.11 |
| 6,600,638 B2 * | 7/2003 | Gill | 360/324.2 |
| 6,724,585 B2 | 4/2004 | Hayashi | |
| 2001/0005300 A1* | 6/2001 | Hayashi | 360/317 |
| 2002/0044396 A1* | 4/2002 | Amano et al. | 360/324.2 |
| 2002/0159203 A1* | 10/2002 | Saito et al. | 360/324.2 |
| 2003/0072109 A1* | 4/2003 | Sharma et al. | 360/324.2 |
| 2003/0128483 A1* | 7/2003 | Kamijo | 360/324.2 |
| 2003/0151859 A1* | 8/2003 | Hayashi et al. | 360/324.2 |
| 2004/0085687 A1* | 5/2004 | Sharma et al. | 360/324.2 |
| 2005/0088788 A1* | 4/2005 | Nishiyama et al. | 360/324.2 |
| 2006/0056114 A1* | 3/2006 | Fukumoto et al. | 360/324.2 |
| 2007/0015293 A1* | 1/2007 | Wang et al. | 438/3 |

FOREIGN PATENT DOCUMENTS

| | | | |
|---|---|---|---|
| JP | 2000-076623 A | 3/2000 | |
| JP | 2000-101164 A | 4/2000 | |
| JP | 2001-325704 A | 11/2001 | |
| JP | 2004-023070 A | 1/2004 | |

* cited by examiner

*Primary Examiner* — Craig A. Renner
(74) *Attorney, Agent, or Firm* — Oliff & Berridge, PLC

(57) ABSTRACT

A magnetic field detecting element has a first lower layer, a second lower layer, a tunnel barrier layer, and an upper layer, wherein the first lower layer, the second lower layer, the tunnel barrier layer, and the upper layer are stacked adjacent to each other in this order, the first lower layer is formed in an amorphous state; and the second lower layer is made of cobalt, iron, nickel or a combination thereof and that is formed in a substantially amorphous state, the second lower layer being in touch with the first lower layer and the tunnel barrier layer on both sides and a film thickness of the second lower layer is approximately between 0.2 and 1.5 nm.

6 Claims, 6 Drawing Sheets

Track Width Direction

Track Width Direction

MAGNETIC FIELD DETECTING ELEMENT HAVING A TUNNEL BARRIER FORMED ON AN AMORPHOUS LAYER

This Application is a U.S. Nonprovisional Utility Patent Application which claims foreign priority from Japanese Application No. 2005-204296, filed Jul. 13, 2005, and from Japanese Application No. 2006-131510, filed May 10, 2006, the complete disclosures of which are incorporated herein by reference.

BACKGROUND OF THE INVENTION

1. Field of the Invention

The present invention relates to a magnetic field detecting element and a method for manufacturing the magnetic field detecting element, and particularly relates to the structure of a TMR element.

2. Description of the Related Art

Conventionally, a GMR (Giant Magneto-resistive) element using a spin valve (SV) film has been widely used as a magnetic field detecting element for a hard disk drive. In recent years, a TMR (Tunnel Magneto-resistance) element has been drawing attention as a magnetic field detecting element having a higher sensitivity. The TMR element is an element that is formed by stacking a lower layer made of magnetic material, nonmagnetic and nonconductive tunnel barrier layer, and an upper layer made of magnetic material in this order. In one example, the magnetization direction of the lower layer is fixed relative to an external magnetic field (this layer may be called a pinned layer), and the magnetization direction of the upper layer can be changed in accordance with the external magnetic field (this layer may be called a free layer). When a sense current is applied in the direction of the stacking of the element, electrons flow from the upper layer to the lower layer (or vice versa) passing through the energy barrier of the nonmagnetic and nonconductive tunnel barrier. This is called the tunneling effect. It is known that electric resistance relative to the sense current changes in accordance with the relative angle between the magnetization direction of the upper layer and the magnetization direction of the lower layer. The change in the resistance relative to the sense current (the change in magnetic resistance) is detected based on the change in the magnetization direction of the upper layer that is caused in accordance with the external magnetic field.

The TMR element detects the magnitude of an external magnetic field, and reads magnetic data in a recording medium in this way. The reproduction output of the magnetic field detecting element depends on the magneto-resistance ratio. The TMR element, which exhibits a particularly larger magneto-resistance ratio than a conventional GMR element, is suitable for providing a magnetic field detecting element having a high output. Incidentally, a film structure in which the lower layer is the pinned layer, as mentioned above, is called the bottom type. However, a film structure in which the lower layer is the free layer (the top type) is also used.

The tunnel barrier layer, which is made of nonmagnetic and nonconductive material, such as alumina, has a small thickness, which is typically about 2 nm, in order to enhance the tunneling effect. Therefore, if the tunnel barrier layer is not formed to be flat, then the film thickness varies depending on locations, and in some cases, the tunnel barrier layer is not formed at some portions. In a portion in which the film is not formed, the upper layer and the lower layer come into contact, leading to a leakage of current. If leakage of current occurs, the amount of current that can be changed due to the magneto-resistive effect is reduced, resulting in a decrease in the magneto-resistance ratio. Even if the upper layer and the lower layer are not in contact, portions having a small film thickness are apt to be damaged and to adversely influence the characteristic for withstanding voltage. From the foregoing, flatness of the tunnel barrier layer is particularly important in order to obtain a stable change in magnetic resistance.

For the reasons mentioned above, a technique for forming the tunnel barrier layer to be flat has been studied. Japanese Patent Laid-Open Publication No. 2000-101164 discloses a technique that uses amorphous magnetic material for at least a part of the lower layer in a top-type film structure. The amorphous magnetic material does not have a crystalline structure. Therefore, a layer that is formed has a surface having a small roughness, and the tunnel barrier layer, which is formed thereon, is easily formed to be flat. The above publication discloses an example of the lower layer that is formed by stacking 84Co9Fe7B (film thickness of 5 nm) and 90Co10Fe (film thickness of 2 nm) in this order (see Paragraph 103). An example is disclosed for a bottom-type film structure in which the lower layer has a stacked structure having a layer that is mainly made of Co, Ni, Fe, and a CoFeB layer. Refer to Japanese Patent Laid-Open Publication No. 2000-76623. Incidentally, the numeral on the left side of an element in the composition formula represents the atomic percent of the element in this specification.

CoFeB is suitable for forming a flat surface because CoFeB can be formed in an amorphous state by adjusting the chemical composition. Therefore, the tunnel barrier layer can be easily formed to be flat by directly forming the tunnel barrier layer on a CoFeB layer. However, the inventors found that directly forming, for example, an alumina layer, which is a typical tunnel barrier layer, on a CoFeB layer in the TMR element may lead to a decrease in the magneto-resistance ratio. In order to improve the magneto-resistance ratio, it is preferable to form a layer that is mainly made of Co, Fe, Ni, such as a CoFe layer, on a CoFeB layer, and then to form the tunnel barrier layer on the layer. However, the layer that is mainly made of Co, Fe, Ni is made of crystalline material. Therefore, even if a surface of a CoFeB layer is formed so that it is flat, it is difficult to form the tunnel barrier layer to be flat, because the layer that is mainly made of Co, Fe, Ni and that has a large roughness is disposed therebetween. If an amorphous layer is used for a part of the lower layer, then it may be easier to form the tunnel barrier layer to be flat. However, ideally, it is desirable that the tunnel barrier layer is formed directly on a flat layer.

SUMMARY OF THE INVENTION

The object of the present invention is to provide a magnetic field detecting element having that has a flatter tunnel barrier layer and thereby exhibits an improved magneto-resistance ratio.

Another object of the present invention is to provide a head gimbal assembly, a hard disc drive, etc. that utilizes the magnetic field detecting element mentioned above.

A magnetic field detecting element according to the present invention comprises a lower layer, a tunnel barrier layer, and an upper layer. The lower layer, said tunnel barrier layer, and said upper layer are stacked adjacent to each other in this order. A magnetization direction of either said lower layer or said upper layer is fixed relative to an external magnetic field, and a magnetization direction of the other can be changed in accordance with said external magnetic field such that a magnitude of said external magnetic field is detected based on a change in resistance relative to a sense current, said change in resistance depending on said external magnetic field. The lower layer comprises: a first layer that is formed in an amorphous state; and a second layer that is made of cobalt, iron, nickel or a combination thereof and that is formed in a substantially amorphous state, said second layer being adjacent to said first layer and said tunnel barrier layer on both sides.

In order to enhance the magneto-resistive effect, it is necessary to prevent the leakage of current in the tunnel barrier layer. In order to achieve this purpose, flatness is particularly required for a surface on which the tunnel barrier layer is deposited. Since the second layer is formed in a substantially amorphous state, and is formed to be flatter than a crystalline layer, the tunnel barrier layer is formed to be flatter. Further, since the second layer is formed of cobalt, iron, nickel or a combination thereof, the present invention is also advantageous for improving the magneto-resistance ratio.

A film thickness of said second layer is preferably approximately between 0.2 and 1.5 nm, and more preferably approximately between 0.2 and 1.2 nm.

A magnetic field detecting element according to the present invention comprises a lower layer, a tunnel barrier layer, and an upper layer. The lower layer, said tunnel barrier layer, and said upper layer are stacked adjacent to each other in this order. A magnetization direction of either said lower layer or said upper layer is fixed relative to an external magnetic field, and a magnetization direction of the other can be changed in accordance with said external magnetic field such that a magnitude of said external magnetic field is detected based on a change in resistance relative to a sense current, said change in resistance depending on said external magnetic field. The lower layer comprises: a first layer that is formed in an amorphous state; and a second layer that is made of ferrocobalt or cobalt and that has a film thickness that ranges approximately between 0.2 and 1.5 nm, said second layer being adjacent to said first layer and said tunnel barrier layer on both sides.

In this embodiment, a film thickness of said second layer is preferably approximately between 0.2 and 1.2 nm.

The first layer is mainly made of cobalt, iron, nickel or a combination thereof and further includes at least one of element, boron, zirconium, hafnium, silicon, tantalum, molybdenum, niobium, palladium, and titanium.

An atomic percent of cobalt in said second layer is preferably approximately 55% or more, and more preferably approximately 80% or more.

A stacked layer assembly according to the present invention comprises the magnetic field detecting element mentioned above.

A wafer according to the present invention that is used to manufacture said stacked layer assembly has at least one thin film magneto-electric transducer.

A head gimbal assembly according to the present invention comprises: a slider that includes said stacked layer assembly mentioned above, said slider being configured to be arranged opposite to a recording medium; and a suspension for elastically supporting said slider.

A hard disk device according to the present invention comprises: a slider that includes said stacked layer assembly mentioned above, said slider being configured to be arranged opposite to a disc-shaped recording medium that is rotatably driven; and a positioning device for supporting said slider and for positioning said slider relative to said recording medium.

A method according to the present invention for manufacturing a magnetic field detecting element comprising a lower layer, a tunnel barrier layer, and an upper layer, wherein said lower layer, said tunnel barrier layer, and said upper layer are stacked adjacent to each other in this order, wherein a magnetization direction of either said lower layer or said upper layer is fixed relative to an external magnetic field, and a magnetization direction of the other can be changed in accordance with said external magnetic field such that a magnitude of said external magnetic field is detected based on a change in resistance relative to a sense current, said change in resistance depending on said external magnetic field. The method comprises the steps of: forming said lower layer by forming a first layer that is formed in an amorphous state and by forming a second layer on said first layer; wherein said second layer is mainly made of ferrocobalt or cobalt and is formed in a substantially amorphous state; forming said tunnel barrier layer on said second layer; and forming said upper layer on said tunnel barrier layer.

The step of forming said lower layer may include forming said second layer such that said second layer has a film thickness that ranges approximately between 0.2 and 1.5 nm, or may include forming said second layer such that said second layer has a film thickness that ranges approximately between 0.2 and 1.2 nm.

A method according to the present invention for manufacturing a magnetic field detecting element comprising a lower layer, a tunnel barrier layer, and an upper layer, wherein said lower layer, said tunnel barrier layer, and said upper layer are stacked adjacent to each other in this order, wherein a magnetization direction of either said lower layer or said upper layer is fixed relative to an external magnetic field, and a magnetization direction of the other can be changed in accordance with said external magnetic field such that a magnitude of said external magnetic field is detected based on a change in resistance relative to a sense current, said change in resistance depending on said external magnetic field. The method comprises the steps of: forming said lower layer by forming a first layer that is formed in an amorphous state and by forming a second layer on said first layer; wherein said second layer is mainly made of ferrocobalt or cobalt and has a film thickness that ranges approximately between 0.2 and 1.5 nm; forming said tunnel barrier layer on said second layer; and forming said upper layer on said tunnel barrier layer.

The step of forming said lower layer may include forming said second layer such that said second layer has a film thickness that ranges approximately between 0.2 and 1.2 nm.

As described above, according to the magnetic field detecting element etc. of the present invention, since flatness of the tunnel barrier layer is improved, and since a ferrocobalt layer or a cobalt layer is arranged adjacent to the tunnel barrier layer, an improved magneto-resistance ratio can be obtained.

The above and other objects, features and advantages of the present invention will become apparent from the following description with reference to the accompanying drawings which illustrate examples of the present invention.

DESCRIPTION OF THE PREFERRED EMBODIMENTS

Figure 1:
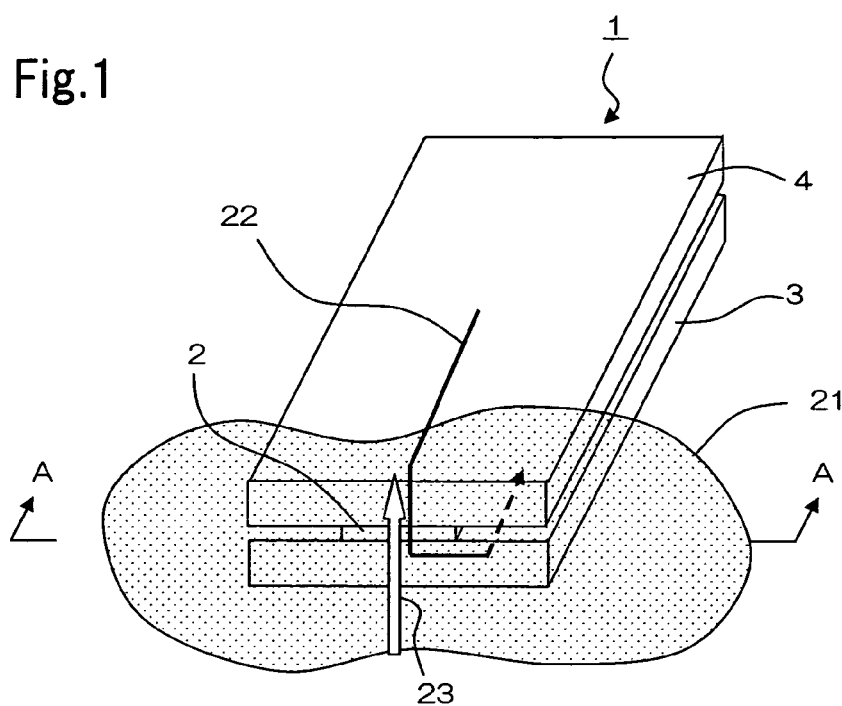
FIG. 1 is a partial perspective view of a thin film magnetic head that uses a magnetic field detecting element of the present invention.

Explanations are given about an embodiment of a magnetic field detecting element (hereinafter, called TMR element 2) with reference to drawings. The magnetic field detecting element of the present invention can be applied to a memory element using the TMR effect, such as MRAM (Magnetic Random Access Memory). However, in the following description, an embodiment is explained in which the magnetic field detecting element is applied to a thin film magnetic head that is used in a hard disk drive. FIG. 1 is a partial perspective view of a thin film magnetic head that uses a magnetic detecting element of the present invention. Thin film magnetic head 1 may be a read-only head, or may be an MR/inductive combined head that further includes a write head portion. TMR element 2 is disposed between lower electrode 3 and upper electrode 4, and the tip portion thereof is arranged opposite to recording medium 21. Lower electrode 3 and upper electrode 4 function as magnetic shield layers for TMR element 2, which is the magnetic detecting element, and function as electrodes to supply sense current 22. Sense current 22, which is generated by a voltage that is applied between lower electrode 3 and upper electrode 4, flows through TMR element 2 in the direction of stacking from upper electrode 4 to lower electrode 3, as indicated by the arrow in FIG. 1. Magnetic field of recording medium 21 that is opposite to TMR element 2 changes as recording medium 21 moves in moving direction 23 of the recording medium. TMR element 2 detects the change in the magnetic field as a change in electric resistance of sense current 22 that is obtained by the TMR effect, and thereby reads magnetic information that is written in each magnetic domain of recording medium 21.

Figure 2:
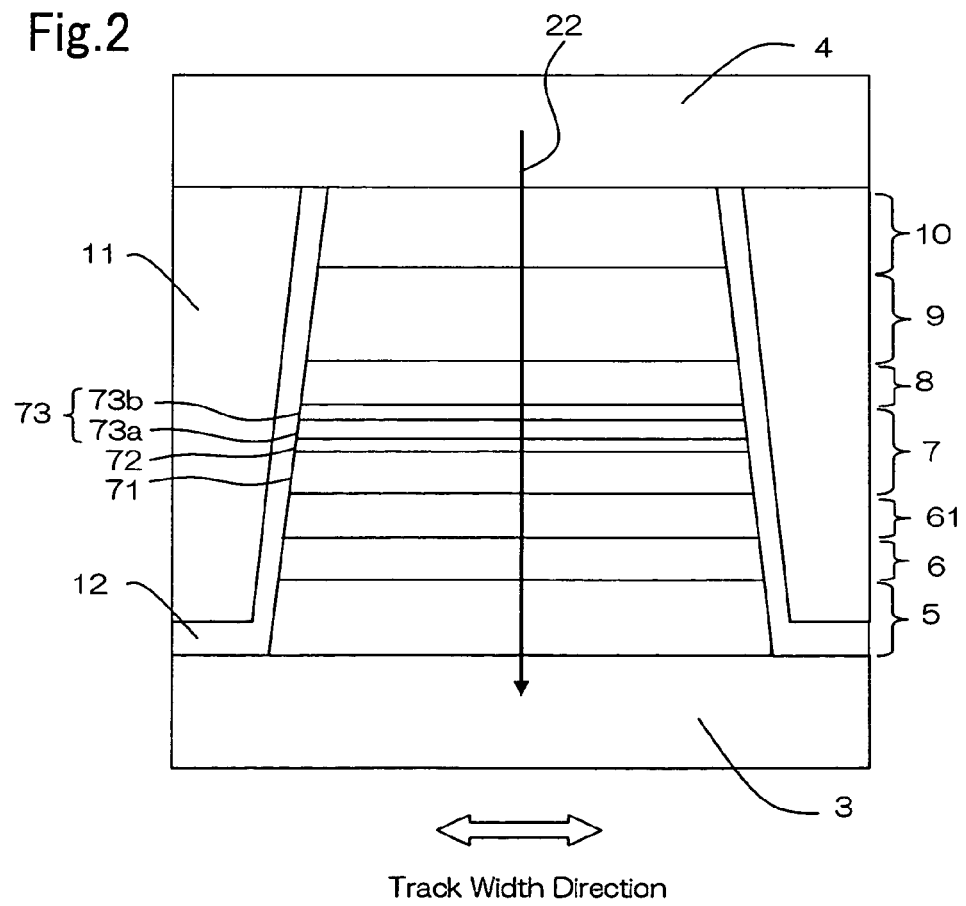
FIG. 2 is a side view of the thin film magnetic head shown in FIG. 1, viewed from the side of the air bearing surface.

FIG. 2 shows the structure of TMR element 2 in a cross-section. The cross section, which is taken along line A-A in FIG. 1, shows the layer structure on the side of ABS. ABS is a surface of thin film magnetic head 1 that is opposite to recording medium 21. Also, Table 1 shows an exemplary layer structure of TMR element 2. Table 1 is written from the bottom row, which corresponds to lower metal layer 5 that is adjacent to lower electrode 3, to the top row, which corresponds to cap layer 10 that is adjacent to upper electrode 4, in the order of stacking.

TABLE 1

| | Layer Structure | | | Composition | Thickness (nm) |
|---|---|---|---|---|---|
| Upper Electlode 4 | | | | NiFe | — |
| TMR Element 2 | Cap Layer 10 | | | Ta | 5 |
| | | | | Ru | 1 |
| | Free Layer 9 | CoFe Layer | | NiFe | 5 |
| | | NiFe Layer | | CoFe | 1 |
| | Tunnel Barrier layer 8 | | | AlOx | 2 |
| | Pinned Layer 7 | Inner Pinned Layer 73 | Second Layer 73b | CoFe | 0.2~1.5 |
| | | | First Layer 73a | CoFeB | 1~3 |
| | | Nonmagnetic Intermediate Layer 72 | | Ru | 0.8 |
| | | Outer Pinned Layer 71 | | CoFe | 1.5 |
| | Antiferromagnetic Layer 61 | | | IrMn | 7 |
| | Seed Layer 6 | | | NiCr | 6 |
| | Lower Metal Layer 5 | | | Ta | 1 |
| Lower Electode 3 | | | | NiFe | — |

TMR element 2 is formed by stacking lower metal layer 5, seed layer 6, pinned layer 7, tunnel barrier layer 8, free layer 9, and cap layer 10 between lower electrode 3 and upper electrode 4 such that the layers are formed adjacent to each other in this order from lower electrode 3 toward upper electrode 4. Pinned layer 7 is the lower layer whose magnetization direction is fixed relative to an external magnetic field, and free layer 9 is the upper layer whose magnetization direction is changed in accordance with the external magnetic field. Tunnel barrier layer 8 is sandwiched between pinned layer 7 and free layer 9. When sense current is applied in a direction in which the sense current passes through each layer (a direction orthogonal to the direction of stacking), the sense current flows beyond tunnel barrier layer 8 due to the tunneling effect, and the resistance to the sense current is changed in accordance with the external magnetic field. The magnitude of the external magnetic field is detected by detecting the change in the resistance, and thereby the magnetic data in the recording medium is read. Next, the structure of main portions of TMR element 2 is explained in detail.

First, lower electrode 3 made of perm-alloy (NiFe) is formed on a substrate, not shown, via a seed layer made of alumina (Al$_2$O$_3$), not shown. Lower metal layer 5, such as a Ta layer, is formed on lower electrode 3. Seed layer 6, such as a NiCr layer, is formed on lower metal layer 5. Metal layer 5 and seed layer 6 may only be formed on the portion of TMR element 2, or may expand over lower electrode 3.

Pinned layer 7 is arranged on seed layer 6 via antiferromagnetic layer 61. Pinned layer 7 is a synthetic pinned layer that is formed by stacking outer pinned layer 71, nonmagnetic intermediate layer 72, and inner pinned layer 73 in this order. The magnetization direction of inner pinned layer 73 is fixed in a predetermined direction because of the antiferromagnetic coupling that is generated between inner pinned layer 73 and outer pinned layer 71 via nonmagnetic intermediate layer 72. In a synthetic pinned layer, the magnetic moments of outer pinned layer 71 and inner pinned layer 73 are mutually cancelled, and thereby the total leakage of magnetic field is limited, while the magnetization direction of inner pinned layer 73 is securely fixed. Outer pinned layer 71 is made of CoFe. Nonmagnetic intermediate layer 72 is made of Ru. Antiferromagnetic layer 61 is provided between outer pinned layer 71 and seed layer 6 in order to fix the magnetization of outer pinned layer 71. Antiferromagnetic layer 61 may be made of IrMn or Mn alloy, such as PtMn, RuRhMn, FeMn, NiMn, PdPtMn, RhMn, or CrMnPt.

Inner pinned layer 73 consists of first layer 73a that is adjacent to nonmagnetic intermediate layer 72 and second layer 73b that is adjacent to tunnel barrier layer 8. First layer 73a is made of ferrocobalt boron (CoFeB) and formed in an amorphous state. The material of first layer 73a is not limited to CoFeB. Specifically, first layer 73a may be mainly made of cobalt, iron, nickel or a combination thereof, and may further include at least one of the elements, boron, zirconium, hafnium, silicon, tantalum, molybdenum, niobium, palladium, and titanium. In this specification, "mainly" means that the atomic percent is 50% or more. First layer 73a may contain a small amount of elements other than the above elements as impurities or additives.

Further, second layer 73b is made of ferrocobalt (CoFe) or cobalt (Co), and has a film thickness ranging approximately between 0.2 and 1.5 nm, as described later. Second layer 73b may contain a small amount of elements other than cobalt and iron as impurities or additives. As described later, second layer 73b is also formed in a substantially amorphous state. Inner pinned layer 73 will be explained in further details in Example.

Tunnel barrier layer 8, which is a nonmagnetic and nonconductive layer, is made of $AlO_x$ (aluminum oxide). Tunnel barrier layer 8 may also be made of aluminum nitride, or oxide or nitride of Ni, Gd, Ta, Mo, Ti, or W. The film thickness is approximately 2 nm. Tunnel barrier layer 8 is preferably formed in an amorphous state.

Free layer 9 has a two-layer structure in which a CoFe layer and a NiFe layer are stacked in this order. Free layer 9 may also be made of a wide variety of ferromagnetic alloy materials, such as Fe, Co, Ni, FeCo, NiFe, or FeCoNi.

Cap layer 10, which is provided to prevent deterioration of TMR element 2, is formed by stacking a Ru layer and a Ta layer, both of which are conductive layers to allow the current that is supplied from upper electrode 4 to flow. Cap layer 10 may also be made of Rh, Pd, Ag, Ir, Pt, Au, or alloys thereof. In the present embodiment, upper electrode 4 is formed on cap layer 10. However, a metal layer made of nonmagnetic metal material, such as a Ta layer, may be provided between cap layer 10 and upper electrode 4 as a seed layer for upper electrode 4.

A pair of hard magnetic films 11 is provided on both sides of TMR element 2 with regards to the track width direction (the direction indicated by the white arrow in FIG. 2). Hard magnetic films 11 apply bias magnetic field to free layer 9 in the track width direction. This arrangement allows the magnetization direction of free layer 9 to be directed in the track width direction when no external magnetic field is applied from the recording medium. Hard magnetic films 11 are formed in a single layer by using hard magnetic material, such as CoCrPt. Alternatively, hard magnetic films 11 may be formed by stacking a soft magnetic layer and an antiferromagnetic layer in this order. Insulating layer 12 is arranged between hard magnetic layer 11 and TMR element 2 in order to prevent the sense current from bypassing hard magnetic film 11.

EXAMPLE

Next, a suitable range of the film thickness and the composition of inner pinned layer 73 were studied based on examples. The composition of samples that were manufactured is shown in Table 1, in which parameters are indicated by shading. The samples were manufactured in accordance with the following procedure. First, seed layer 6 was formed on lower metal layer 5. Next, synthetic pinned layer 7, which includes outer pinned layer 71, nonmagnetic intermediate layer 72, and inner pinned layer 73, was formed on seed layer 6. Then, an Al film was deposited on synthetic pinned layer 7. Oxygen was introduced to form an $AlO_x$ film, i.e., tunnel barrier layer 8 while the stacked layers were kept in a vacuum device. Next, free layer 9 and cap layer 10 were formed. The layers that were stacked were formed into a predetermined shape by using a conventional photolithography technique and ion milling technique to manufacture TMR element 2.

Each layer was deposited by using a general depositing machine. The film thickness was controlled by adjusting depositing time. Specifically, a layer having a sufficient thickness is formed in advance by taking a long time, and the film thickness that was obtained per unit time (deposition rate) was calculated from the relationship between the deposition time and the film thickness that was measured. The relationship between deposition time t and film thickness d is approximated by the linear function represented by $d = r \cdot t + a$. In this formula, r is the deposition rate, and a is a constant that does not depends on the deposition time. Once this relation is obtained, deposition time t for obtaining target film thickness d is calculated by an inverse operation, and a layer having target film thickness d can be formed.

(Experiment 1) Study on Dependency of Second Layer 73b on the Film Thickness

First, an experiment was conducted using the parameters shown in Table 2 in order to study dependency of second layer 73b on the film thickness. The composition of first layer 73a was fixed to 60Co20Fe20B, and the composition of second layer 73b was fixed to 90Co10Fe. The film thickness of second layer 73b was changed between 0 (second layer 73b was not formed) and 2 nm. The value of MR/RA, i.e., the MR ratio (magneto-resistance ratio) divided by resistance R of the element and the sectional area A of the element, was used for the index of evaluation. Even if MR ratio is the same, a smaller value of RA leads to a reduction in resistance of the head and improves the characteristic as a head. Therefore, use of MR/RA, as the index of the evaluation, enables more accurate evaluation of the characteristic that depends on the film structure (the composition and the film thickness). Experiment 1 corresponds to Sample No. A1-A6 in Table 2.

TABLE 2

| No | Composition of First Layer | Thickness of First layer (nm) | Composition of Second Layer | Thickness of Second layer (nm) | RA | MR | MR/RA |
|---|---|---|---|---|---|---|---|
| A1 | 60Co20Fe20B | 1 | 90Co10Fe | 0 | 4.33 | 27.85 | 6.44 |
| A2 | | | | 0.5 | 3.61 | 26.44 | 7.32 |
| A3 | | | | 1 | 3.73 | 27.73 | 7.43 |
| A4 | | | | 1.2 | 3.48 | 25.41 | 7.30 |

TABLE 2-continued

| No | Composition of First Layer | Thickness of First layer (nm) | Composition of Second Layer | Thickness of Second layer (nm) | RA | MR | MR/RA |
|---|---|---|---|---|---|---|---|
| A5 | | | | 1.5 | 3.47 | 23.54 | 6.79 |
| A6 | | | | 2 | 3.45 | 20.71 | 6.00 |
| B1 | | | 80Co20Fe | 1 | 3.88 | 28.32 | 7.30 |
| B2 | | | 70Co30Fe | | 4.29 | 29.51 | 6.88 |
| B3 | | | 55Co45Fe | | 4.57 | 29.98 | 6.56 |
| B4 | | | 100Co | | 4.04 | 33.78 | 8.35 |

Figure 3:
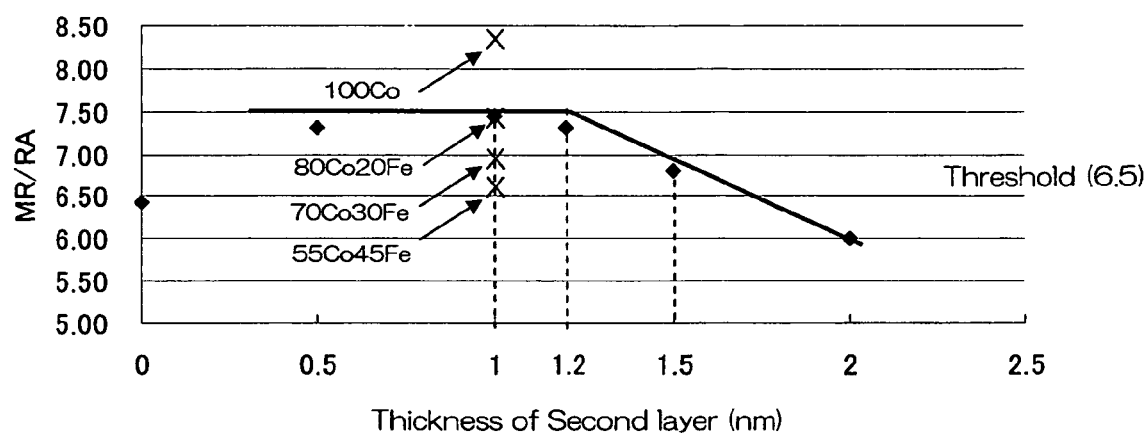
FIG. 3 is a graph in Experiment 2 showing the relationship among the film thickness of the second layer, the composition of the second layer, and MR/RA.

The result is shown in FIG. 3 in a graph. Since an example in which second layer 73b has a film thickness of 2 nm (Sample No. A6) is found in prior art, this thickness was used as the border between prior art and the present embodiment. Since an example in which second layer 73b is not provided (Sample No. A1) is found in prior art, this case was also used as the border between prior art and the present embodiment. Therefore, the embodiment has the film thicknesses that correspond to Sample No. A2-A5. Samples having MR/RA that is larger than the values in both Sample No. A1 and A6, i.e., samples having MR/RA that exceeds about 6.5, have advantage over prior art.

Each sample having second layer 73b whose film thickness ranged between 0.5 and 1.5 nm showed MR/RA that is larger than about 6.5, and exhibited improved magneto-resistive effect. Also, the samples having second layer 73b whose film thickness ranged between 0.5 and 1.2 nm showed MR/RA between 7.3 and 7.4, exhibiting a particularly excellent result. The inventors think that the reason why MR/RA is improved in accordance with a decrease in the film thickness of second layer 73b is that second layer 73b is formed in a substantially amorphous state, and that flatness of the surface is improved. The reason why second layer 73b is formed in a substantially amorphous state is not completely clear. However, the inventors think as follows. Specifically, while the film thickness of a CoFe film, which is deposited on first layer 73a that is made of CoFeB, is small, the CoFe film grows energetically more stably in a state that is close to an amorphous state because of the influence of the CoFeB seed layer that is formed in an amorphous state. When the film thickness becomes large to some extent, the CoFe film grows more stably in a crystalline state, which is originally the stable state for CoFe. It is thought in the present embodiment that second layer 73b having a film thickness that is smaller than the threshold thickness, which is around 1.2 to 1.5 nm, was not formed in the crystallized state, and remained in the amorphous state. Incidentally, the substantially amorphous state includes not only the state in which entire second layer 73b is formed in an amorphous state, but also the state in which a small amount of crystalline portions co-exists.

Figure 4A:
FIGS. 4A and 4B are TEM photographs showing the vicinity of the tunnel barrier layer in the present embodiment and in a comparative example.
Figure 4A:
Figure 4B:
Figure 4B:

FIGS. 4A and 4B show TEM photographs in the vicinity of first layer 73a, second layer 73b, and tunnel barrier layer 8 of the TMR element of the present embodiment. FIG. 4A is the TEM photograph of Case A3 of the present embodiment. FIG. 4B, which is a comparative example, is the TEM photograph of a prior art film structure in which first layer 73a is not provided and second layer 73b is made of CoFe. As will be clear from a comparison between the drawings, first layer 73a made of CoFeB and second layer 73b made of CoFe are, so to speak, formed in one amorphous structure in the present embodiment. On the other hand, in the prior art film structure, the CoFe layer is formed in a crystalline state. In this way, it was actually confirmed from the present embodiment that second layer 73b was formed in an amorphous state.

Even if the film thickness of second layer 73b is less than 0.5 nm, it is improbable that the effect can be significantly reduced, and a similar degree of effect of can be expected unless the film thickness is substantially 0 nm. This is because the effect of improving the magneto-resistance ratio is anticipated as long as second layer 73b exists, and because even if second layer 73b has a small film thickness, flatness is ensured for second layer 73b by virtue of first layer 73a that is formed in an amorphous state under second layer 73b. Therefore, the lower limit of the film thickness of second layer 73b is actually depends on limitation on manufacturing. It is thought that the manufacturing limitation, which depends on the performance of a depositing machine in addition to the particle diameter of molecules, is substantially 0.2 nm.

(Experiment 2) Study on Dependency of Second Layer 73b on the Composition

Next, a similar experiment was conducted in which the film thickness of second layer 73b was fixed to 1 nm and the chemical composition (atomic percent) of Co and Fe was used as a parameter. The chemical composition of Co and Fe was changed from 80% Co to 55% Co, and the result was compared with the case of 90% Co. Further, a study was made for a case in which second layer 73b was composed of 100% Co. Therefore, Sample No. A3 and B1-B4 were compared to each other in Experiment 2. FIG. 3 shows the results in a graph. The results of Sample No. B1-B4 are indicated by "X" in FIG. 3. From the result, MR/RA tends to increase in accordance with the increase in the atomic percent of cobalt, and MR/RA tends to worsen in accordance with the decrease in the atomic percent of cobalt. However, MR/RA exceeds the threshold value of 6.5 when the atomic percent of Co is no less than 55%, and the effect of improving the magneto-resistance ratio was confirmed. Accordingly, the atomic percent of cobalt is preferably 55% or more, and more preferably 80% or more.

Additionally, needless to say, the composition of first layer 73a is not limited to 60Co20Fe20B, as in the embodiment, as long as an amorphous state is formed. For example, a similar experiment was conducted for two cases of composition, i.e., for 75Co5Fe20B and 65Co15Fe20B, in which the composition of second layer 73b was fixed to Co90Fe10, the film thickness thereof was fixed to 1 nm, and the film thickness of first layer 73a was fixed to 1 nm. It was confirmed that MR/RA exceeded the threshold value of 6.5, although MR/RA somewhat worsened compared with the case of 60Co20Fe20B.

As described above, according to the present invention, inner pinned layer 73, which is formed under tunnel barrier layer 8 with regards to the direction of stacking and which is formed adjacent to tunnel barrier layer 8, consists of the first layer formed in an amorphous state and the second layer mainly made of cobalt. Further, the second layer is formed in a substantially amorphous state by forming the second layer in a film thickness that is smaller than the film thickness in prior art. Therefore, the magneto-resistive effect can be improved, because the flatness of tunnel barrier layer 8, which is particularly required for tunnel barrier layer 8, is improved, and because a layer that is mainly made of ferrocobalt is arranged adjacent to tunnel barrier layer 8.

In addition, a TMR element of the bottom type was explained in the present embodiment. However, the present invention can also be applied to the top type in a similar manner. In this case, the free layer may be formed of the first layer that is formed in an amorphous state and the second layer that is mainly made of ferrocobalt. Furthermore, the pinned layer does not need to be a synthetic pinned layer, and may be a single-layer pinned layer that does not use antiferromagnetic coupling.

Figure 5:
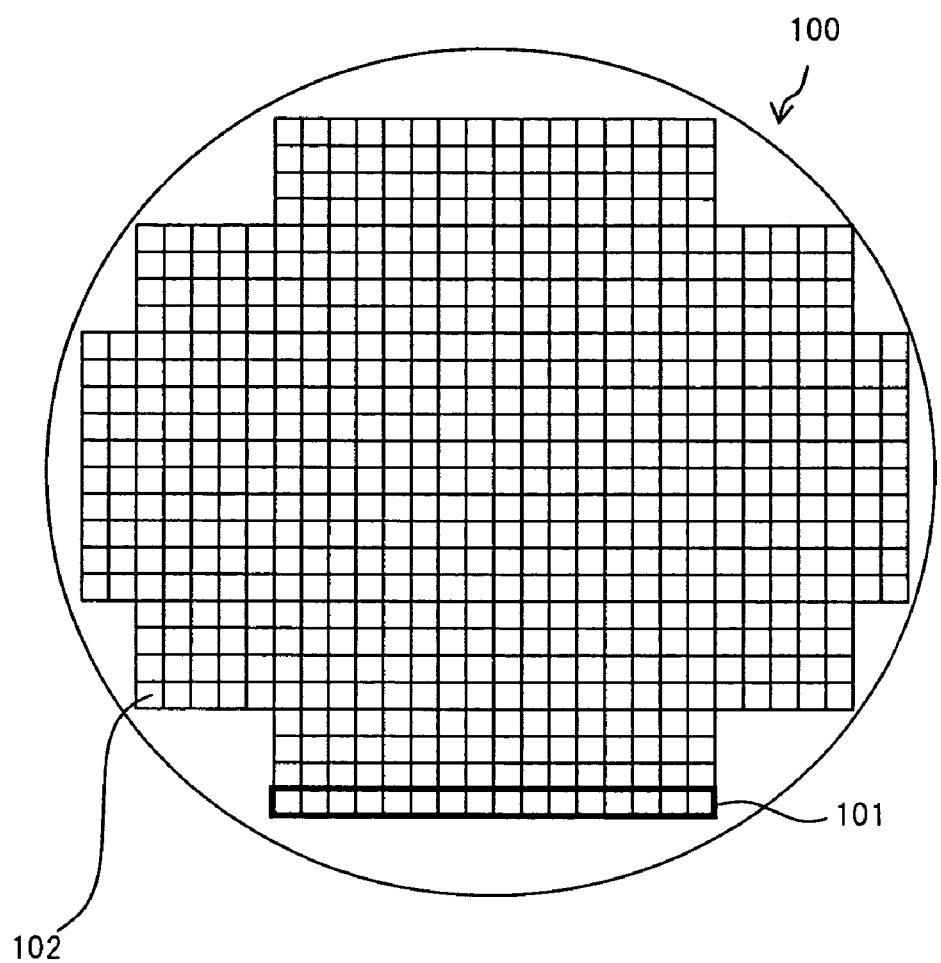
FIG. 5 is a plan view of a wafer that is used to manufacture a stacked layer assembly according to the present invention.

Next, explanation will be made regarding a wafer for fabricating a thin-film magnetic head described above. FIG. 5 is a schematic plan view of a wafer. Wafer 100 has a plurality of thin-film magneto-electric transducers 102 which al least includes a stacked structure from 1 lower electrode 3 to upper electrode 4. Wafer 100 is diced into bars 101, in which a plurality of thin-film magneto-electric transducers 102 are formed in a row. Bar 101 serves as a work unit in the process of forming ABS. Bar 101 is diced into sliders each having a thin-film magnetic head after lapping. Spaces for dicing, not shown, are provided in wafer 100 to dice wafer 100 into bars 101 and the sliders.

Figure 6:
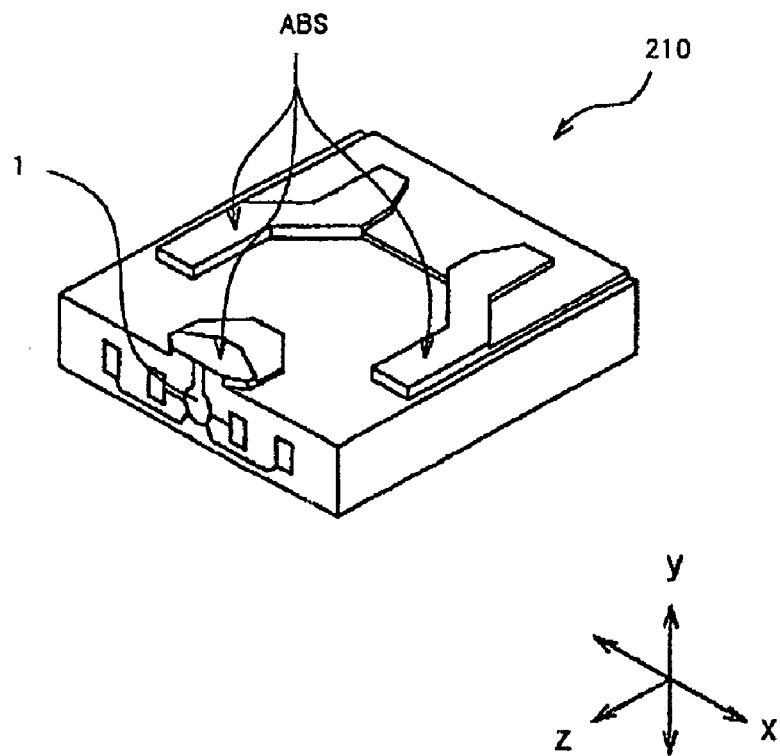
FIG. 6 is a perspective view of a slider that is included in a head gimbal assembly and that incorporates the stacked layer assembly according to the present invention.

Explanation next regards a head gimbal assembly and a hard disk drive that uses the thin-film magnetic head. Referring to FIG. 6, slider 210 which is included in the head gimbal assembly will be described first. In a hard disk drive, slider 210 is a stacked layer assembly that is arranged opposite to a hard disk, which is a rotationally-driven disciform storage medium. Slider 210 has a substantially hexahedral form. One of the six surfaces of slider 210 forms ABS, which is positioned opposite to the hard disk. When the hard disk rotates in the z direction shown in FIG. 6, an airflow which passes between the hard disk and slider 210 creates a dynamic lift which is applied to slider 210 downward in the y direction of FIG. 6. Slider 210 is configured to lift up from the surface of the hard disk with this dynamic lift effect. In proximity to the trailing edge (the end portion at the lower left in FIG. 6) of slider 210, which is on the outlet side of the airflow, thin-film magnetic head 1 is formed.

Figure 7:
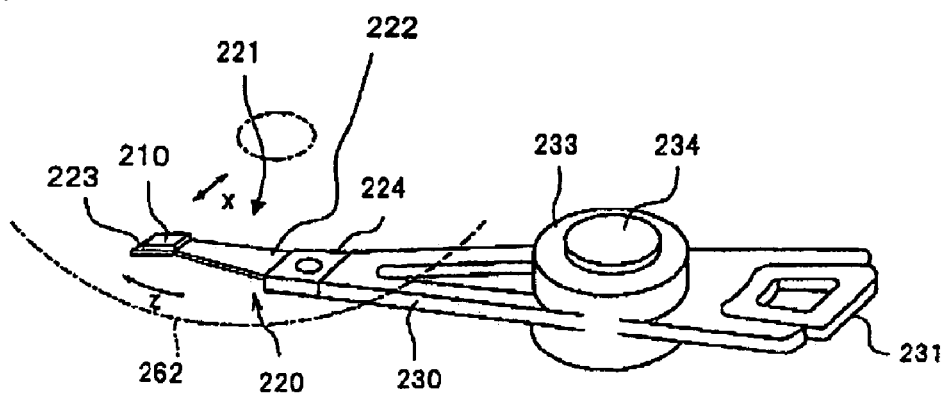
FIG. 7 is a perspective view of a head arm assembly that includes a head gimbal assembly that incorporates the stacked layer assembly according to the present invention.

Referring to FIG. 7, head gimbal assembly 220 that has the thin-film magnetic head will be explained next. Head gimbal assembly 220 is provided with slider 210, and suspension 221 for resiliently supporting slider 210. Suspension 221 has; load beam 222 in the shape of a flat spring and made of, for example, stainless steel; flexure 223 attached to one end of load beam 222, and to which slider 210 is fixed, while providing an appropriate degree of freedom to slider 210; and base plate 224 provided on the other end of load beam 222. The portion of flexure 223 to which slider 210 is attached has a gimbal section for maintaining slider 210 in a fixed orientation.

The arrangement in which a head gimbal assembly 220 is attached to a single arm 230 is called a head arm assembly. Arm 230 moves slider 210 in the transverse direction x with regard to the track of hard disk 262. One end of arm 230 is attached to base plate 224. Coil 231, which constitutes a part of the voice coil motor, is attached to the other end of arm 230. In the intermediate portion of arm 230, bearing section 233 which has shaft 234 to rotatably hold arm 230 is provided. Arm 230 and the voice coil motor to drive arm 230 constitutes an actuator.

Figure 8:
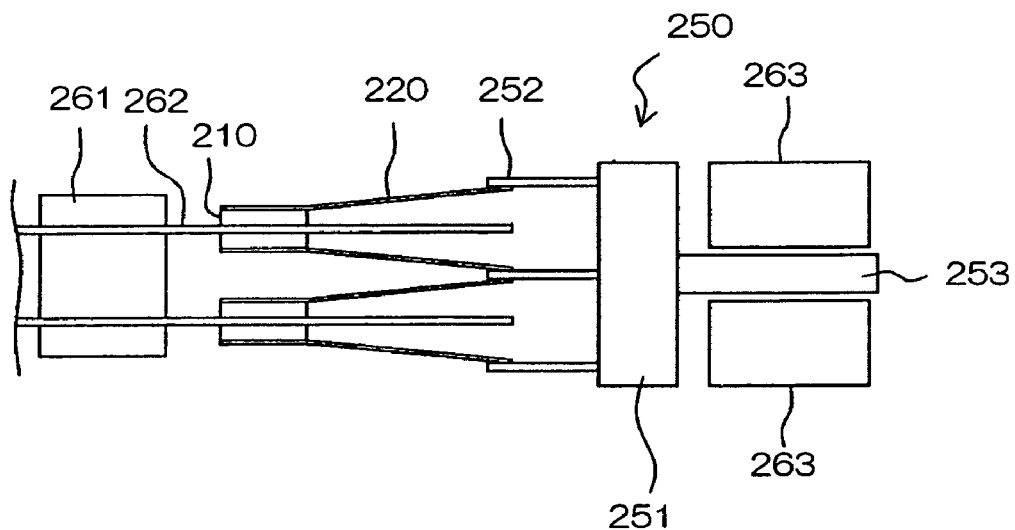
FIG. 8 is a diagram showing essential parts of a hard disk drive that incorporates the stacked layer assembly according to the present invention.
Figure 9:
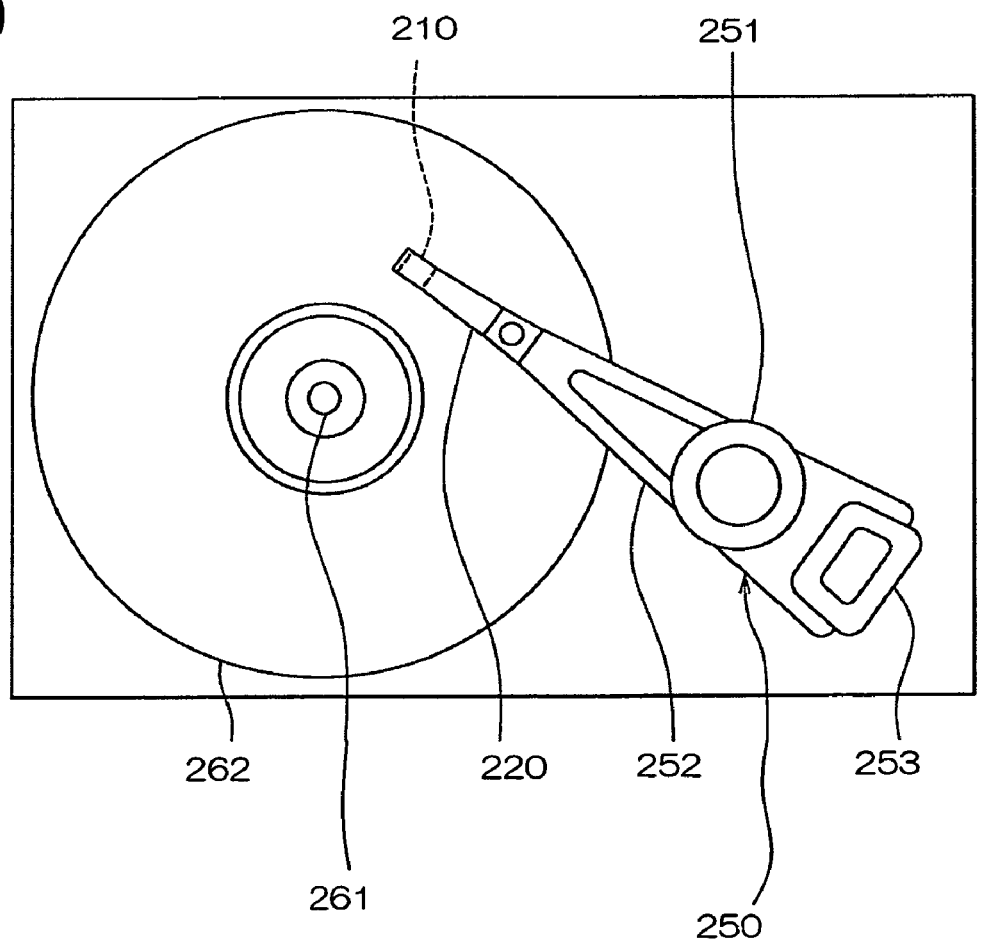
FIG. 9 is a plan view of a hard disk drive that incorporates the stacked layer assembly according to the present invention.

Referring to FIG. 8 and FIG. 9, a head stack assembly and a hard disk drive that use the thin-film magnetic head as a head element will be explained next. The arrangement in which a head gimbal assembly 220 is attached to the respective arm of a carriage having a plurality of arms is called a head stack assembly. FIG. 8 is an explanatory diagram illustrating an essential part of a hard disk drive, and FIG. 9 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil, is attached to carriage 251 on the side opposite to arms 252. The voice coil motor has permanent magnets 263 which are arranged in positions opposite to each other interposing coil 253 of head stack assembly 250 therebetween.

Referring to FIG. 8, head stack assembly 250 is installed in the hard disk drive. The hard disk drive has a plurality of hard disks connected to spindle motor 261. Two sliders 210 are arranged per each hard disk 262 at positions opposite to each other interposing hard disk 262 therebetween. Head stack assembly 250 and the actuator, except for sliders 210, work as a positioning device. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is contained in slider 210 records information to hard disk 262 with a write head, and reads information recorded in hard disk 262 with a read head.

Although a certain preferred embodiment of the present invention has been shown and described in detail, it should be understood that various changes and modifications may be made without departing from the spirit or scope of the appended claims.

What is claimed is:

1. A magnetic field detecting element comprising a substrate, a first lower layer, a second lower layer, a tunnel barrier layer, and an upper layer,
    wherein said first lower layer, said second lower layer, said tunnel barrier layer, and said upper layer are stacked adjacent to each other in this order such that said first lower layer is located nearer from said substrate than said upper layer,
    wherein a magnetization direction of said first and second lower layers is fixed relative to an external magnetic field, and a magnetization direction of the upper layer can be changed in accordance with said external magnetic field such that a magnitude of said external magnetic field is detected based on a change in resistance relative to a sense current, said change in resistance depending on said external magnetic field, wherein
    said first lower layer is made of CoFeB;
    said second lower layer is made of ferrocobalt and has a film thickness that ranges approximately between 0.2 and 1.5 nm, said second lower layer being formed in a substantially amorphous state and being in touch with said first lower layer and said tunnel barrier layer on both sides; and
    an atomic percent of cobalt in said second layer is approximately between 80% and 90%.

2. The magnetic field detecting element according to claim 1, wherein the film thickness of said second layer is approximately between 0.2 and 1.2 nm.

3. A stacked layer assembly comprising the magnetic field detecting element according to claim 1.

4. A wafer comprising said stacked layer assembly according to claim 3.

5. A head gimbal assembly comprising:
    a slider that includes said stacked layer assembly according to claim 3, said slider being configured to be arranged opposite to a recording medium; and
    a suspension for elastically supporting said slider.

6. A hard disk device comprising:

a slider that includes said stacked layer assembly according to claim 3, said slider being configured to be arranged opposite to a disc-shaped recording medium that is rotatably driven; and a positioning device for supporting said slider and for positioning said slider relative to said recording medium.

* * * * *